(12) United States Patent
Trojan et al.

(10) Patent No.: US 12,198,935 B2
(45) Date of Patent: Jan. 14, 2025

(54) ATMOSPHERIC PLASMA IN WAFER PROCESSING SYSTEM OPTIMIZATION

(71) Applicant: Axus Technology, LLC, Chandler, AZ (US)

(72) Inventors: Daniel Ray Trojan, Chandler, AZ (US); Robert Clark Roberts, Charlotte, NC (US)

(73) Assignee: Axus Technology, LLC, Chandler, AZ (US)

( * ) Notice: Subject to any disclaimer, the term of this patent is extended or adjusted under 35 U.S.C. 154(b) by 389 days.

(21) Appl. No.: 16/496,796

(22) PCT Filed: Mar. 22, 2018

(86) PCT No.: PCT/US2018/023820
§ 371 (c)(1),
(2) Date: Sep. 23, 2019

(87) PCT Pub. No.: WO2018/175758
PCT Pub. Date: Sep. 27, 2018

(65) Prior Publication Data
US 2020/0381262 A1 Dec. 3, 2020

Related U.S. Application Data

(60) Provisional application No. 62/476,041, filed on Mar. 24, 2017.

(51) Int. Cl.
| | | |
|---|---|---|
| *H01L 21/306* | (2006.01) | |
| *B24B 37/04* | (2012.01) | |
| *B24B 37/11* | (2012.01) | |
| *C23F 4/00* | (2006.01) | |
| *H01J 37/32* | (2006.01) | |
| *H01L 21/321* | (2006.01) | |

(52) U.S. Cl.
CPC ...... *H01L 21/30625* (2013.01); *B24B 37/044* (2013.01); *B24B 37/11* (2013.01); *C23F 4/00* (2013.01); *H01J 37/32825* (2013.01); *H01L 21/3212* (2013.01)

(58) Field of Classification Search
None
See application file for complete search history.

(56) References Cited

U.S. PATENT DOCUMENTS

| | | |
|---|---|---|
| 5,391,855 A | 2/1995 | Tanisaki |
| 5,743,788 A * | 4/1998 | Vanell ................. C23C 4/11 451/41 |

(Continued)

OTHER PUBLICATIONS

International Search Report received in PCT/US2018/023820.

*Primary Examiner* — Sylvia MacArthur
(74) *Attorney, Agent, or Firm* — Knobbe, Martens, Olson & Bear, LLP

(57) ABSTRACT

A method and a system for polishing a wafer is disclosed. In one aspect, the method includes generating atmospheric plasma. The method further includes treating a component of a wafer processing system with the atmospheric plasma. The method further includes delivering a slurry containing abrasive and corrosive particles to a surface of the wafer processing system which includes atmospheric plasma-treated component. The method further includes polishing a wafer with the abrasive and corrosive particles.

16 Claims, 7 Drawing Sheets

(56) References Cited

U.S. PATENT DOCUMENTS

| | | | | |
|---|---|---|---|---|
| 5,823,854 | A | * | 10/1998 | Chen ............... B24B 53/017 451/41 |
| 5,942,445 | A | * | 8/1999 | Kato ............... H01L 21/02019 438/692 |
| 5,961,772 | A | * | 10/1999 | Selwyn ............ H01J 37/32366 156/345.43 |
| 6,057,245 | A | * | 5/2000 | Annapragada ......... B24D 13/14 438/711 |
| 6,284,668 | B1 | * | 9/2001 | Imahashi ......... H01J 37/32357 257/E21.252 |
| 6,335,291 | B1 | * | 1/2002 | Freeman ............... H05H 1/46 438/712 |
| 7,077,721 | B2 | * | 7/2006 | Hu ............... B24B 53/017 205/663 |
| 7,323,080 | B2 | * | 1/2008 | Kim ............... H01L 21/67051 156/345.39 |
| 8,597,084 | B2 | * | 12/2013 | Chen ............... B24B 37/16 451/288 |
| 9,406,485 | B1 | | 8/2016 | Cheng et al. |
| 2002/0037684 | A1 | * | 3/2002 | Yamamoto ......... H01L 21/3212 257/E21.252 |
| 2002/0081948 | A1 | | 6/2002 | Fruitman |
| 2002/0115734 | A1 | | 8/2002 | Obeng et al. |
| 2003/0207099 | A1 | | 11/2003 | Gillmor et al. |
| 2009/0068375 | A1 | | 3/2009 | Dobbyn et al. |
| 2016/0332278 | A1 | * | 11/2016 | Shibuya ............ H01J 37/32055 |
| 2020/0381262 | A1 | * | 12/2020 | Trojan ............... C23F 4/00 |

* cited by examiner

ATMOSPHERIC PLASMA IN WAFER PROCESSING SYSTEM OPTIMIZATION

INCORPORATION BY REFERENCE TO ANY PRIORITY APPLICATIONS

This application is a utility application claiming the benefit of the earlier filing date of provisional application Ser. No. 62/476,041 filed Mar. 24, 2017 which is hereby incorporated by reference in its entirety under.

BACKGROUND

Field

The disclosed technology relates to a method and device for improving slurry and chemical mechanical planarization (CMP) pad performance for the planarization of thin films using atmospheric-pressure plasma (i.e., AP plasma or normal pressure plasma).

Description of the Related Technology

During chemical mechanical planarization or polishing (CMP), an abrasive and either acidic or alkalinic slurry is applied via a metering pump or mass-flow-control regulator system onto a rotating polishing pad/platen. A substrate or wafer is held by a wafer carrier which is rotated and pressed against a polishing platen for a specified period of time. The slurry is normally brought to the polishing platen in a single-pass distribution system. The wafer is polished (i.e., planarized) by both mechanical means (e.g., abrasion) and chemical means (e.g., corrosion) during the CMP process.

The slurry particles in their media may not be distributed evenly between the rotating wafer and the rotating polishing pad/platen. At least some of the polishing slurry may not be effective nor productive because it is swept to the edge of the polishing pad/platen by centrifugal force, and also by the "squeegee" action of the wafer against the polishing pad/platen. Particles that do not contact the wafer surface don't contribute to planarization and are wasted, increasing cost and reducing efficiency of the CMP process. Aspects of the pad, such as its hydrophobic nature, contribute to variations in the distribution of the slurry and its sub-micron abrasive particles and corrosive chemicals.

There is a need to improve the slurry and pad performance to increase CMP efficiency and reduce the cost of manufacturing.

SUMMARY

One aspect of the disclosed technology is a method for polishing a wafer. The method includes generating atmospheric plasma. The method further includes treating a polishing pad with the atmospheric plasma. The method further includes delivering a slurry containing abrasive and corrosive particles to a surface of the treated polishing pad. The method further includes polishing a wafer with the abrasive and corrosive particles.

Treating the polishing pad with atmospheric plasma alters properties of the surface of the polishing pad. In particular, it reduces the hydrophobic nature of the pad and increases its hydrophilic properties. This results in better distribution of slurry particles because of improved interactions between the slurry and the polishing pad surface.

A second aspect is a method of processing a CMP polishing pad, by treating the pad with atmospheric plasma. A third aspect is a method of processing a wafer surface by treating the surface with atmospheric plasma. A fourth and fifth aspect are a wafer and a CMP polishing pad, respectively, each with an atmospheric plasma-treated surface.

According to an embodiment, a method for treating a component of a wafer processing system is disclosed comprising generating atmospheric plasma and treating a surface of the component of the wafer processing system with the atmospheric plasma.

According to an aspect, the component comprises a polishing pad.

According to yet another aspect, the component comprises a silicon wafer.

According to another aspect, a contact angle is reduced between the surface and a fluid on the surface.

According to yet another aspect, a first treating step is disclosed comprising reducing the contact angle to a first contact angle, and a second treating step is disclosed comprising reducing the first contact angle to a second, lower contact angle between the surface and the fluid on the surface.

According to another aspect, the contact angle is reduced between the surface of the component and a CMP slurry on the surface.

According to yet another aspect, generating a second atmospheric plasma prior to the second treating step is disclosed, where the second generating step comprises adjusting one or more parameters of the atmospheric plasma, relative to the first generating step, the parameters selected from the group of increasing the discharge power, increasing the exposure time and selecting the nature of the gas.

According to another embodiment, a method for polishing a wafer is disclosed, where the method comprises generating atmospheric plasma, treating a surface of at least one of a polishing pad and a wafer with the atmospheric plasma, to form an atmospheric plasma-treated surface, delivering a slurry to the polishing pad, and polishing the wafer with the polishing pad and the slurry.

According to another aspect, a contact angle between the fluid and the atmospheric plasma-treated surface is less than 115 degrees after the treating.

According to yet another aspect, the treatment step results in a decrease in a contact angle between the atmospheric plasma-treated surface and the slurry by at least 10 degrees, relative to a contact angle of the same slurry on an untreated surface of the at least one of the polishing pad and the wafer.

According to yet another embodiment, a system for polishing a wafer is disclosed, where the system comprises a polishing pad affixed to a top surface of a platen, an atmospheric plasma generator configured to treat at least one of the polishing pad and a wafer with atmospheric plasma, a slurry delivery system configured to deliver processing slurry to the polishing pad, and a wafer carrier configured to hold a wafer and allow the wafer to be polished by the polishing pad.

According to another aspect, the wafer carrier comprises a membrane attached to the wafer carrier, the membrane configured to provide pressure between the wafer and the polishing pad.

According to yet another aspect, the atmospheric plasma generator is embedded in the polishing pad to enable in-situ application of atmospheric plasma to the wafer.

According to another aspect, the atmospheric plasma generator is mounted above the polishing pad.

According to yet another aspect, the atmospheric plasma generator is configured to treat the polishing pad with atmospheric plasma.

According to another aspect, the atmospheric plasma generator is movable relative to the polishing pad.

According to yet another aspect, the atmospheric plasma generator is mounted on a pad conditioning arm.

According to another embodiment, a chemical mechanical planarization (CMP) component is disclosed, comprising a body and an atmospheric plasma-treated surface.

According to yet another aspect, the CMP component is one of a polishing pad or a silicon wafer.

According to another embodiment, the atmospheric plasma-treated surface of the CMP component has a contact angle of 115 degrees or less, relative to a fluid on the surface.

According to another aspect, the CMP component further comprises the fluid, where the fluid comprises CMP slurry.

According to yet another embodiment, an atmospheric plasma-treated component for integration in a chemical mechanical planarization process is disclosed, the component prepared by a process comprising the steps of generating atmospheric plasma, and treating a surface of the component with the atmospheric plasma, to form an atmospheric plasma-treated surface.

According to another aspect, the component is one of a polishing pad or a wafer.

According to another embodiment, a system for treating a component of a chemical mechanical planarization (CMP) system is disclosed, where the system comprises a component of a chemical mechanical planarization (CMP) system, and an atmospheric plasma generator configured to treat the component with atmospheric plasma.

According to another aspect, the component comprises at least one of a CMP polishing pad or a silicon wafer.

BRIEF DESCRIPTION OF THE DRAWINGS

The above, as well as additional objects, features and advantages of the disclosed technology, will be better understood through the following illustrative and non-limiting detailed description of certain embodiments of the disclosed technology, with reference to the appended drawings. In the drawings like reference numerals will be used for like elements unless stated otherwise.

DETAILED DESCRIPTION

Figure 1:
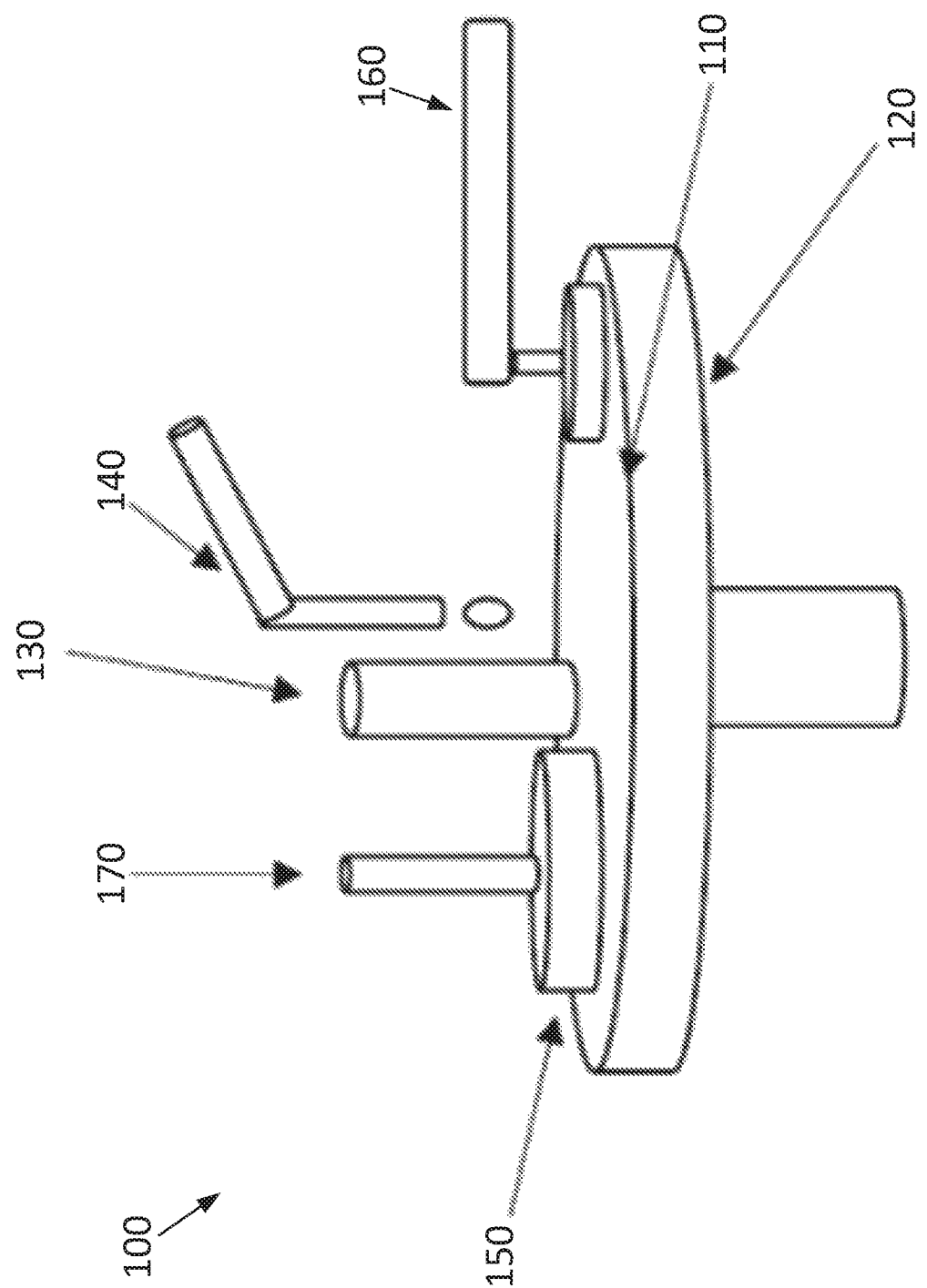
FIG. 1 is a schematic illustration of a chemical mechanical planarization system with an atmospheric plasma system for treating a polishing pad, showing a wafer carrier holding a wafer in a processing position.

Detailed embodiments of the disclosed technology will now be described with reference to the drawings.

The adoption and use of chemical mechanical polishing (CMP) for the planarization of thin films in the manufacture of semiconductor ICs, MEMS devices, and LEDs, among many other similar applications is common among all companies manufacturing "chips" for these types of devices. This adoption includes the manufacture of chips for mobile telephones, tablets and other portable devices, plus desktop and laptop computers. The growth in nanotechnology and micro-machining holds great promise for ever-widespread use and adaptation of digital devices in the medical field, in the automotive field, and in the Internet of Things (the "IoT"). Chemical mechanical polishing for the planarization of thin films was invented and developed in the early 1980s by scientists and engineers at the IBM Corporation. Today, this process is widespread on a global basis and is one of the truly enabling technologies in the manufacture of nearly all digital devices.

Integrated circuits are manufactured with multiple layers and alternating layers of conducting materials (copper, tungsten, aluminium, etc.), insulating layers (silicon dioxide, silicon nitride, etc.), and semiconducting material (polysilicon). A successive combination of these layers is sequentially applied to the wafer surface, but because of the implanted devices on the surface, topographical undulations are built up upon the device structures, as is the case with silicon dioxide insulator layers. These unwanted topographical undulations must be flattened or "planarized" before the next layer can be deposited. In the case of copper layers, the copper is deposited on the surface to fill contact vias and make effective vertical paths for the transfer of electrons from device to device and from layer to layer. This procedure continues with each layer that is applied (usually applied by a deposition process). In the case of multiple layers of conducting material (multiple layers of metal), this could result in numerous polishing procedures (one for each layer of conductor, insulator, and semiconductor material) in order to achieve successful circuitry.

The CMP process is an enabling technology in the manufacture of multi-layer circuitry that makes this all possible.

The major cost contributor in the CMP process is made up of the collective costs associated with the consumable set, specifically the polishing slurries and the polishing pads. Typical polishing slurries used in CMP processing comprise, for example, colloidal suspensions of abrasive particles (e.g., colloidal silica, colloidal alumina, colloidal ceria, etc.) suspended or contained within, for example, a water-based medium.

The polishing pads are typically polyurethane based. Additionally, the typical CMP polishing pad is usually from 18" to 24" in diameter; this dimension dictated by the size of the polishing platen (i.e., table) on the popular polishing machines in use around the world. However, in some applications (e.g., precision optical applications) they may be even larger in diameter (e.g., up to 48" or larger). These polishing pads are attached to a very flat polishing platen (i.e., polishing table) by pressure sensitive adhesive.

During the CMP process, a slurry is applied, via a metering pump or mass-flow-control regulator system, onto a rotating polishing pad. In addition, a substrate or wafer is held by a wafer carrier which is rotated and pressed against the polishing platen for a specified period of time. The term "substrate" and "wafer" are used interchangeably herein, and include, for example, semiconductor or silicon wafers, flat panel displays, glass plates or disks, plastic work-pieces, and other substantially rigid, flat and thin work-pieces of various shapes (e.g., round, square rectangular, etc.) and sizes on which one or more embodiments of the apparatuses and processes disclosed herein can be implemented. Additionally, a slurry may be brought to the polishing platen in, for example, a single-pass distribution system. The normal expectation is that the slurry particles in their media will be distributed evenly between the rotating wafer, and the rotating platen and/or polishing pad. It is quite typical, however, for much of the polishing slurry to not be effective or not be productive because it is swept to the edge of the polishing pad/platen by centrifugal force, and/or by "squeegee" action of the wafer against the polishing pad/platen. Thus, this portion of the polishing slurry may never reach the wafer surface, rendering that portion of slurry an inactive participant in the polishing activity. In some instances, the hydrophobic nature of the surface of the polishing pad contributes to the polishing slurry being swept aside easily and ultimately, swept into a waste drain.

A force is applied to the wafer (e.g., by a substrate carrier head) to provide pressure between the wafer and the polishing pad, and thus, press the wafer into the pad for processing. In addition, the wafer and the pad both have motion to create a relative velocity. The motion and force leads to portions of the pad creating abrasion by pushing the abrasive particles or other abrasive against the wafer (i.e., substrate) while it moves across the wafer surface. The corrosive chemicals in the slurry alter the material being polished on the surface of the wafer. This mechanical effect of abrasion combined with chemical alteration is called chemical mechanical planarization or polishing (CMP). Accordingly, the removal rate of material from the substrate can be orders of magnitude higher due to both the chemical and mechanical effects simultaneously compared to either one (chemical or mechanical) taken alone. Similarly, the smoothness of the surface after polishing may also be optimized by using chemical and mechanical effects together.

Yield is the driving force in determining success at the manufacturing level for many products (e.g., integrated circuits, MEMS, LEDs, etc.). Accordingly, the accumulated cost of manufacturing a solid-state device is termed the "Cost-of-Ownership" (CoO) and this term is also applied to each of the required manufacturing steps. Ultimately, the CoO of the CMP process is one of the highest CoO figures in the 500 to 800 individual manufacturing steps required to make a semiconductor "chip" and its associated digital device.

Two of the primary challenges in the CMP process are the reduction of the optimal amount of polishing slurry needed per layer being polished and increasing the lifetime of the polishing pad and the polishing slurry.

For several years, various individuals and innovative companies have attempted to manufacture recycling systems for the polishing slurries. These systems have mostly been either off-line in nature (i.e., away from the polishing room) or in-line in nature (i.e., within the slurry distribution system at Point-of-Use (POU) positioned near each polishing machine). Four important factors to monitor and control for effective CMP polishing slurries are the pH of the slurry, the particle size of the abrasive component, the specific gravity of the slurry, and the cleanliness of the slurry.

As the slurry is distributed onto the polishing pad, environmental factors, such as evaporation, tend to change the fluid media content in the slurry. This change in content tends to affect the pH of the slurry, which, in turn, tends to negatively affect the specific gravity of the slurry. During the polishing process, material (e.g., copper, polysilicon, etc.) is removed from the surface of the wafer that creates microscopic particles. These microscopic particles either remain in suspension in the slurry, become embedded in the polishing pad or some combination of both. These microscopic particles cause scratches on the surface of the film being polished, and thus catastrophic failures in the circuitry.

These physical changes in the make-up of the polishing slurry, while perhaps not disastrous to certain lapping slurries or fine grind slurries in machine shops and precision optical manufacturing applications, can render the surfaces of semiconductor silicon wafers tragically, catastrophically, and/or permanently damaged. These scratches and failures can render a damaged chip useless, and thus negatively affect yield. For these and other reasons, slurry recycling/recirculation systems, while common in metal lapping applications and in some precision optical applications where surface quality tolerances are in microns, have not been particularly successful in the CMP process industry (e.g., within semiconductor fabs) or, for example, in foundries where surface quality tolerances are measured in nanometers and even Angstroms.

It is an object of the disclosed technology to address the many issues described above, with respect to slurry waste, for example, through the utilization of atmospheric-pressure plasma (i.e., AP plasma, atmospheric plasma, or normal pressure plasma) in the CMP process to provide increased CMP yields and an overall improvement in the CMP process.

Plasma is a state of matter that occurs when a gas is supplied with enough energy that it becomes ionized and transforms into plasma. As such, atmospheric plasma describes plasma in pressure that is the same as the surrounding atmosphere (i.e., not a vacuum). Plasma is generally described as something beyond a solid, a liquid, or a gas.

In some embodiments, plasma is created when energy is applied to a gas in order to reorganize its electronic structure such as its atoms and its molecules to produce excited ions. Accordingly, atmospheric plasma is generated by electrical energy, whereas thermal plasma is generated by heat energy. ("Surface Modification of Polymers using AP Cold Plasma Technology," Polymer Science; University of Ghent). In a non-limiting example, a direct current (DC) plasma jet may operate as follows in providing atmospheric plasma. By means of a high-voltage discharge (5-15 kV, 10-100 kHz) a pulsed electric arc is generated. A process gas, usually oil-free compressed air flowing past this discharge section, is excited and converted to the plasma state. This plasma then passes through a jet head to arrive on the surface of the material to be treated. The jet head is at earth potential and in this way largely holds back potential-carrying parts of the plasma stream. In addition, the jet head determines the geometry of the emergent beam. Other systems include alternating current (AC) Excitation and/or Microwave Excitation may be used in the generation of atmospheric plasma.

Parameters important and integral to atmospheric plasma operation include, for example, discharge power, exposure time, the nature of the gas used, the nature of the substrate, etc.

FIG. 1 is a schematic illustration of a chemical mechanical planarization (CMP) system 100 including an atmospheric plasma system 130 for treating a polishing pad 110. System 100 can include a wafer carrier 150 configured to hold and process a wafer. In the illustrated embodiment, the wafer carrier 150 is in a processing (i.e., lowered) position, holding the wafer or substrate 155 (not shown in FIG. 1) against a polishing pad 110. The polishing pad 110 may be positioned on a supporting surface, such as a surface of a platen 120. In some embodiments, the platen 120 may be configured to raise upward to meet the components of system 100, such as the wafer carrier, the pad conditioning arm, the atmospheric plasma generator, and the slurry delivery system.

Figure 2:
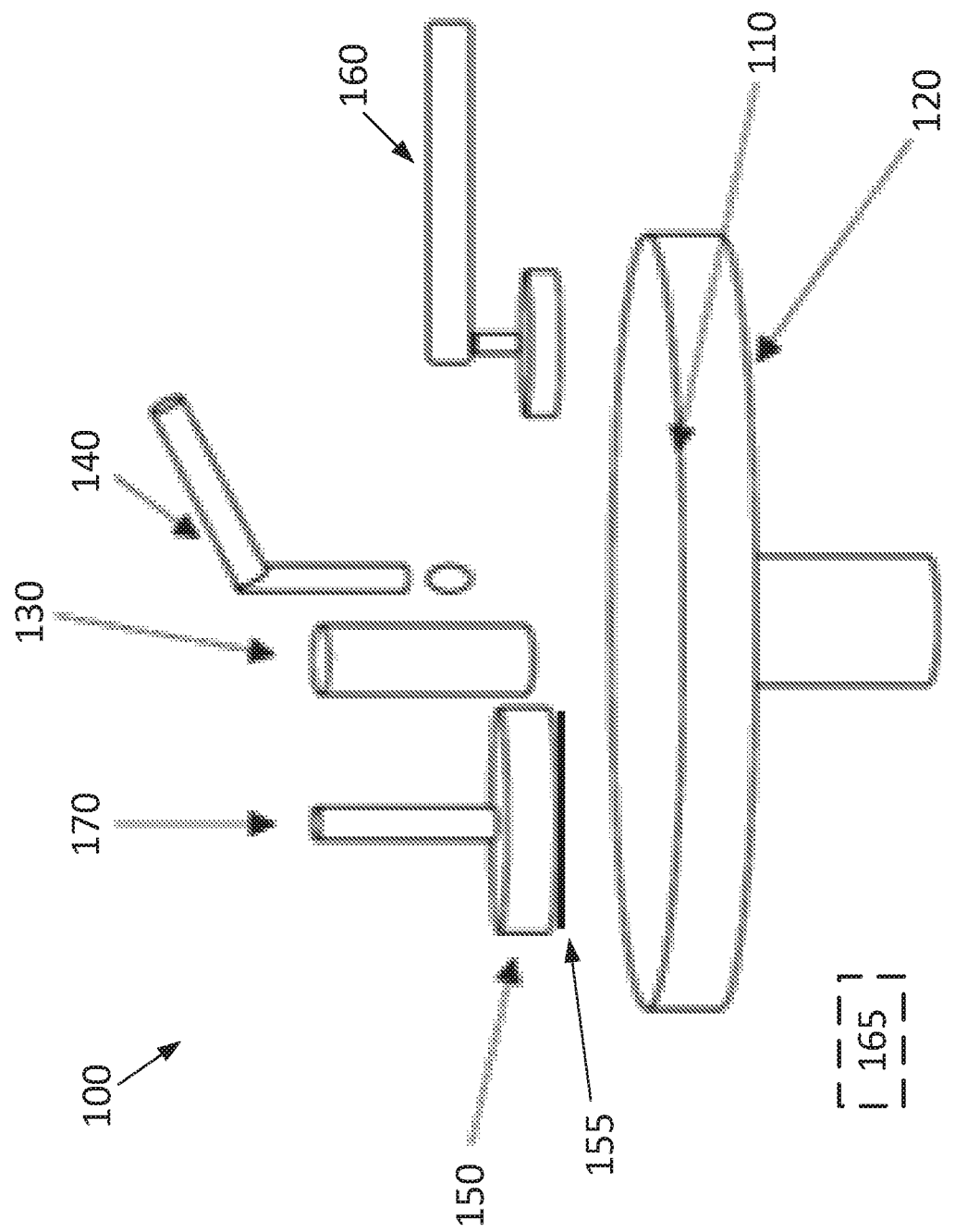
FIG. 2 is a view of the chemical mechanical planarization system of FIG. 1, showing the wafer carrier holding the wafer in a loading position.

FIG. 2 is a view of the chemical mechanical planarization system of FIG. 1, showing a wafer 155 held by the wafer carrier 150 in a loading (e.g., raised or upper) position. In some embodiments, the wafer 155 can be held, for example, by force of a vacuum. For example, the wafer carrier 150 can hold or attach wafer 155 with a vacuum system, so that the surface of the wafer 155 to be polished faces towards polishing pad 110 when attached to wafer carrier 150. Referring to both FIGS. 1 and 2, system 100 can include a slurry delivery system 140 configured to deliver a processing slurry to the wafer 155 and allow it to be chemically/mechanically planarized against polishing pad 110. System 100 can include a pad conditioning arm 160, which includes a pad conditioner at one end and can be configured to treat or "refresh" the surface roughness (or other processing characteristics of the pad) during or between processing cycles.

Referring to system 100 of FIGS. 1 and 2, polishing pad 110 is on the top surface of platen 120 which rotates about an axis. Other orientations and directions of movement can be implemented as a person of ordinary skill in the art would readily appreciate (e.g., counter clockwise about a vertical axis, clockwise, etc.). Platen 120 may be configured to rotate clockwise, counterclockwise, back and forth in a ratcheting motion, etc.

In some embodiments, the atmospheric plasma generator 130 can be part of a larger atmospheric plasma generator system that can additionally include, for example, a system control unit, a plasma discharge nozzle, a compressed clean dry air source, air hoses, cables, etc. Treatment with atmospheric plasma can reduce the hydrophobic nature of one or more components of system 100. For example, treatment of polishing pad 110 with atmospheric plasma tends to make the surface of the pad more hydrophilic, thus improving, for example, the surface energy of the pad, and in turn, its wettability characteristics. Experimental evidence shows that a characteristic of a hydrophobic surface, as the surface resists fluid absorption (i.e., absorption of one or more fluid droplets), is exemplified in a high "contact angle" between the pad surface and the fluid droplet. Accordingly, adaptation of atmospheric plasma to treat the surface of a polishing pad or wafer reduces the hydrophobic nature, and increases wettability of the surface, resulting in a reduction in the "contact angle," as described with reference to FIGS. 5-9. Thus, by reducing the contact angle, improved absorption of the fluid results. Moreover, as the surface energy increases, or with repeated plasma treatment steps, or changes in the plasma treatment parameters, the "contact angle" is reduced, resulting in further absorption improvements (e.g., increased absorption).

This reduction in the "contact angle" of the fluid droplet in relationship to the polishing pad surface improve the fluid (slurry) retention capabilities of the polishing pad surface and of each pore in the pad surface, and thus helps to improve the effectiveness of the polishing slurry. These improvements in the wettability, lower hydrophobic nature, and lower contact angle of the pad surface in turn result in the need for less overall slurry consumption and improves the Cost of Ownership of the CMP process. An additional advantage of this type of treatment is that the modification caused by the atmospheric plasma may, in some embodiments, be limited only to the uppermost layers of the polishing pad. In such embodiments, the atmospheric plasma treatment may reduce any effect to the characteristics of the overall thickness of the polishing pad. The process is environmentally friendly in its initial use on the polishing pad, and also in the fact that less polishing slurry is needed to perform the CMP polishing process and thus less slurry is wasted. Reduced slurry use by, for example, reducing waste results in a reduced need for chemical disposition or costly innovative recycling technologies.

Thus, in a non-limiting example, the use of atmospheric plasma to reduce the hydrophobic surface characteristics and capillarity of CMP polishing pads can be used as a pre-polishing treatment for newly installed polishing pads or as an in-situ real time process component active during the actual polishing activity.

The atmospheric plasma generator system 130 can be mounted stationary relative to, and above the surface of the polishing pad 130, as shown in FIGS. 1 and 2, or can be mounted on a movable support structure, as described further herein. In some embodiments, the generator system 130 may be configured to lower such that generator system 130 is in close proximity to the polishing pad 110. The generator system 130 can be oriented or otherwise configured in any way suitable to treat the polishing pad 130 with atmospheric plasma. The atmospheric plasma generator can provide treatment prior to, after, and/or during a wafer polishing process.

The atmospheric plasma treatment process described herein results in an atmospheric plasma-treated surface with desirable properties and characteristics. In an example, an atmospheric plasma treatment process for treating a polishing pad with atmospheric plasma results in an atmospheric plasma-treated polishing pad (i.e., a "treated pad"), wherein the surface of the polishing pad has been treated with atmospheric plasma one or more times (i.e., iteratively as described with reference to FIGS. 7-9) and thus, embodies those desirable characteristics as described throughout this disclosure (e.g., reduced contact angle, increased wettability, increased absorption, increased surface energy, etc.) which ultimately result in an improved CMP process.

In an embodiment, the slurry delivery system 140 can deliver a slurry (e.g., a polishing slurry) to a surface of a treated polishing pad 110. The polishing slurry may include or contain sub-micron abrasive and corrosive particles. In a non-limiting example, the polishing slurry typically comprises colloidal suspensions of abrasive particles (e.g., colloidal silica, colloidal alumina, colloidal ceria, etc.). In some embodiments, the abrasive particles are suspended in a water-based medium or any other suitable medium. In various embodiments, the slurry delivery system 140 includes a metering pump, a mass-flow-control regulator system, or any other suitable fluid delivery components as a person of ordinary skill in the art would understand.

Accordingly, abrasive particles and corrosive chemicals in the slurry, deposited by the slurry delivery system 140 on the polishing pad 110, mechanically and chemically polish the wafer through abrasion and corrosion, respectively. As shown, the slurry delivery system 140 delivers a slurry that flows downward through the system and ultimately, onto polishing pad 110. In some embodiments, wafer carrier 150 and polishing pad 110 can move relative to each other in any number of different ways, to provide the polishing. For example, wafer carrier 150 can apply a downward force against the platen 120, such that the wafer 155 is pressed against the polishing pad 110, with abrasive particles and corrosive chemicals of the slurry between the wafer 155 and the polishing pad 110 providing chemical and mechanical polishing while polishing pad 110 and wafer carrier 150 move relative to each other. The relative motion between polishing pads and wafer carriers can be configured in various ways, as would be understood by a person of ordinary skill in the art, and either or both can be configured to oscillate, move linearly, and/or rotate, counter clockwise and/or clockwise relative to each other.

Pad conditioning arm 160 conditions the surface of polishing pad 110, by pressing against polishing pad 110 with a force, with relative movement therebetween, such as the relative motion described above with respect to the polishing pad and wafer carrier 155. The pad conditioning arm 160 in the illustrated embodiment can oscillate, with a pad conditioner at one end. In some embodiments, the pad conditioner is configured to rotate clockwise or counterclockwise, for example. In some embodiments, the pad conditioner contacts polishing pad 110 and may make contact as the pad conditioner rotates.

Figure 3:
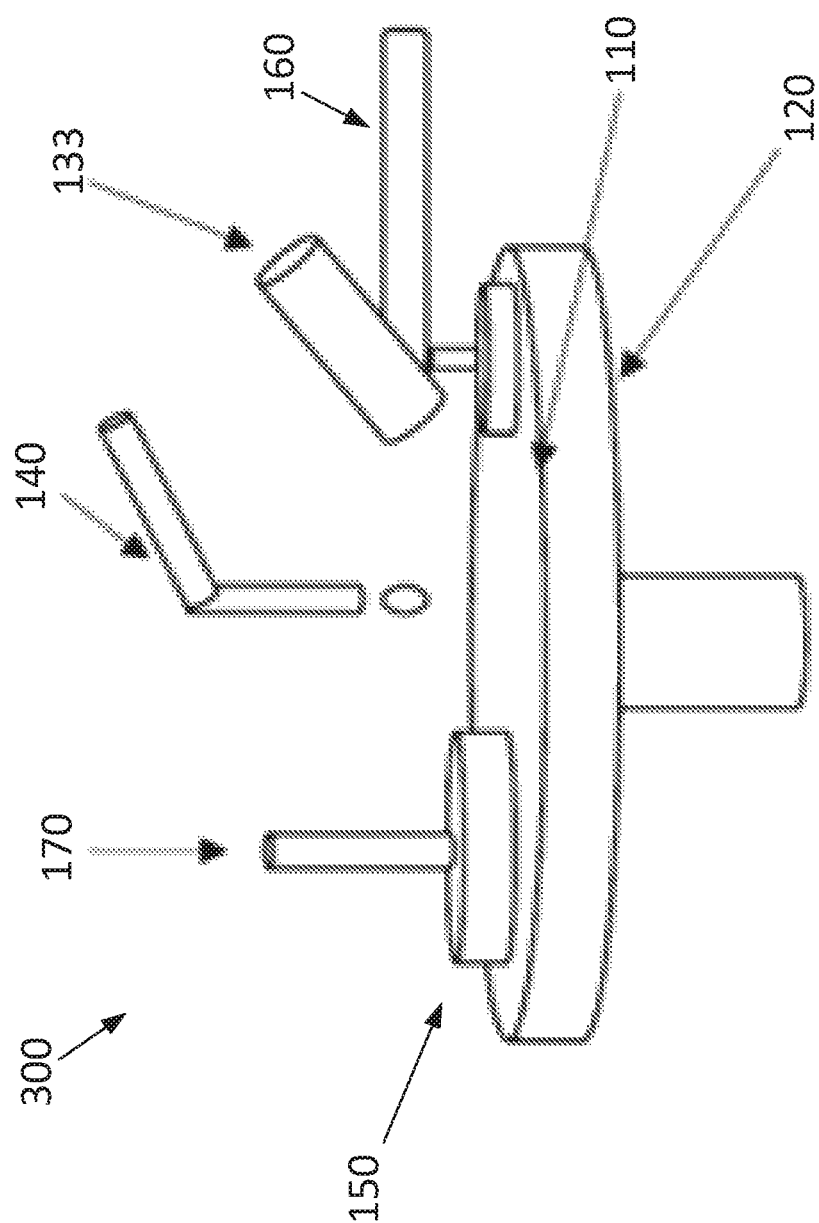
FIG. 3 is a schematic illustration of a chemical mechanical planarization system with an atmospheric plasma system attached to a movable support structure.

FIG. 3 is a schematic illustration of a chemical mechanical planarization system with an atmospheric plasma generator system 133 attached to a support structure. For example, the support structure may be moveable, such that it can provide variable positioning of a treatment area for treating the polishing pad 110 prior to, after, and/or during polishing. Atmospheric plasma generator system 133 can be mounted either on existing conditioning arms or alternatively, on a separate arm dedicated for atmospheric plasma positioning independent of the pad conditioner and the pad conditioners sweeping control mechanisms. For example, the atmospheric plasma generator system 133 can be attached to an arm or other support structure, such as pad conditioning arm 160 that moves, for example, or oscillates, to provide such movement functionality. System 300 of FIG. 3 includes polishing pad 110, platen 120, slurry delivery system 140, wafer carrier 150, wafer 155, and pad conditioning arm 160, as described above with respect to FIGS. 1 and 2. However, the system of FIG. 3 differs from the system of FIGS. 1 and 2 in that the atmospheric plasma generator 133 is mounted onto the pad conditioning arm 160, to enable variable positioning of the treatment area for treating the polishing pad 110 prior to and/or during polishing. In various embodiments, the atmospheric plasma generator 133 can be mounted on a different support structure, such as a separate arm (not shown), to allow independent positioning of the atmospheric plasma generator 133 relative to the movement provided by the pad conditioning arm 160. For example, an atmospheric plasma generator can be positioned and configured to allow it to treat one or more locations, and/or components of a CMP system. For example, an atmospheric plasma generator can be configured to treat a surface of a wafer. An atmospheric plasma generator can be configured to treat two or more components of a CMP system, such as a wafer surface and/or a polishing pad surface. In another example, two or more atmospheric plasma generators can be implemented within the CMP systems described herein. For example, two atmospheric plasma generators may be included for each platen in a system where a system may have multiple platens for CMP processing.

Figure 4:
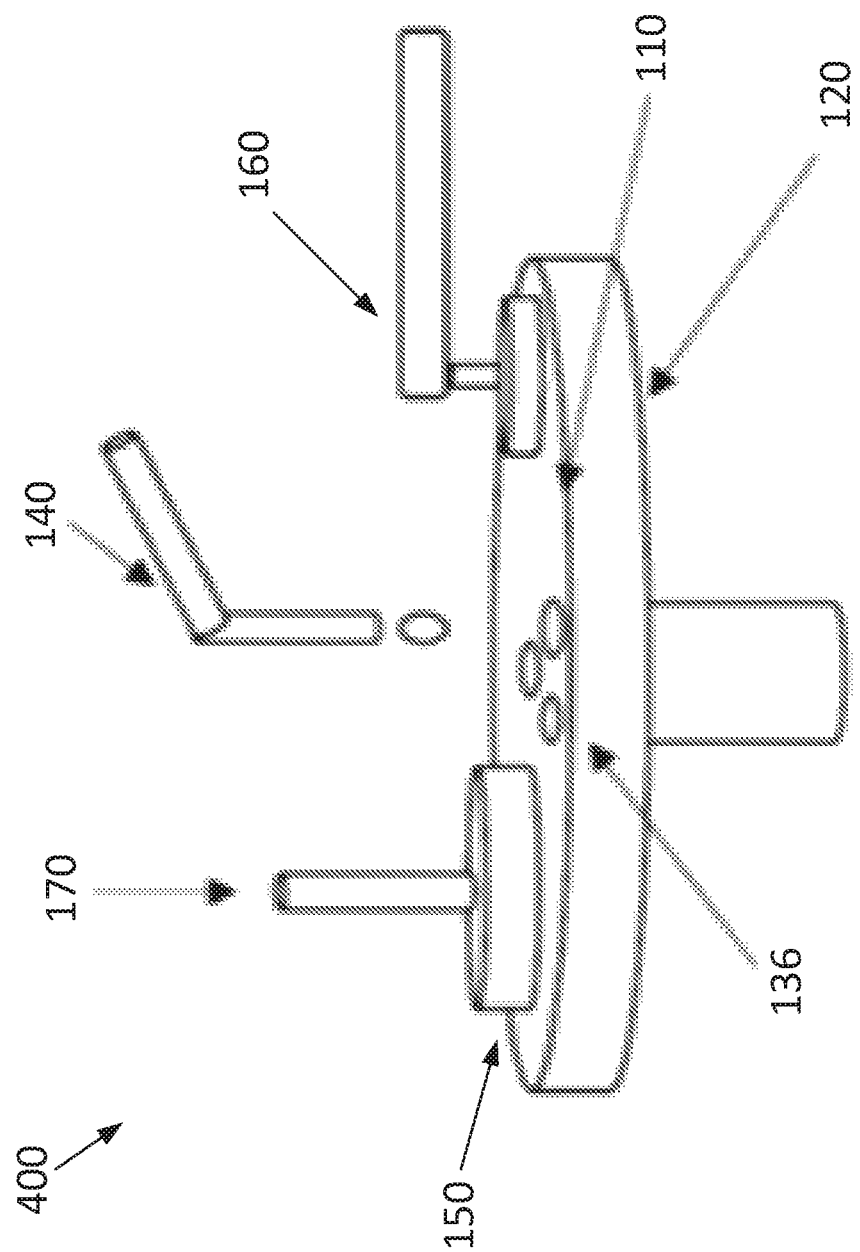
FIG. 4 is a schematic illustration of a chemical mechanical planarization system with an atmospheric plasma generator embedded in a polishing pad to enable in-situ application of atmospheric plasma to the wafer surface.

FIG. 4 is a schematic illustration of a chemical mechanical planarization system 400 with one or more atmospheric plasma generators 136 embedded within another component of the system 400. For example, one or more generators 136 can be embedded within a platen, wafer carrier, or within a polishing pad. In a non-limiting example, the atmospheric plasma generator 136 may be positioned and assembled with respect to the polishing pad to allow the atmospheric plasma to be directed at the polishing pad from within the polishing pad. Such embodiments can enable in-situ application of atmospheric plasma to, for example, the wafer surface. The system of FIG. 4 includes polishing pad 110, platen 120, slurry delivery system 140, wafer carrier 150, wafer 155, and pad conditioning arm 160, as described above with respect to FIGS. 1-3. However, the system of FIG. 4 differs from the system of FIGS. 1-3 in that the atmospheric plasma generator 136 is embedded in the polishing pad 110 to enable in-situ application of atmospheric plasma to the wafer surface, which enhances clean-ability of the surface of a wafer or polishing pad. In some CMP applications, a temperature range of 20° to 25° C. (68°-77° F.) may be desirable for an in-situ atmospheric plasma system.

Although FIGS. 1-4 illustrate aspects of a CMP apparatus (e.g., wafer carrier 150, wafer 155), a person of ordinary skill of art would understand that CMP machines can be assembled in any number of different ways. In addition, FIGS. 1-4 do not necessarily illustrate a complete CMP apparatus (which might otherwise include reference to a wafer carrier head membrane, a body of a CMP apparatus, system for delivering wafer substrates to a particular CMP apparatus, etc.), but is merely meant to be an illustrative example to highlight the disclosed technology that is the subject of this disclosure. A person of ordinary skill in the art would understand that additional components of a CMP system (e.g., membrane, etc.) may be incorporated in the systems described herein. For example, wafer carrier head 150 may further comprise a vacuum system configured to secure a wafer against the membrane using vacuum pressure or suction. The resilient membrane can include one or more separate zones, with compressed gas applied to the top surface or back side of the membrane. Said pressure can be transmitted via the membrane to the top surface or back side of the wafer in order to effect the material removal during CMP. The wafer carrier head can include one or more rigid support components which provide means for fastening the membrane to its mating components, holding the membrane to its desired shape and dimension, and/or clamping the membrane to provide a sealed volume for sealing and containing the controlled gas pressure. Additionally, any of the apparatus and systems described herein can include a controller (e.g., controller 165, FIG. 2) which can be configured to provide the functionality of the methods described herein, and additional functionality. Furthermore, reference numeral 170 illustrates the relative location of a complete CMP apparatus (not shown) which would apply downward force to the wafer 150 attached to wafer carrier head 150 in polishing the wafer against a polishing pad fixed to a rotating platen. For example, the CMP apparatus would apply a downward force to a wafer carrier against polishing pad 110 to polish a wafer 155 when the wafer carrier is configured in a lowered position as shown in FIG. 1. Additionally, wafer carrier head 150 may comprise a membrane attached to the remaining body of the wafer carrier head 150. The membrane (not shown) can be configured to provide pressure between the wafer 155 and the polishing pad 110.

In addition, the CMP system, including the wafer carrier, the polishing platen, and/or the slurry distribution system, may be configured to be controlled by a control system (not shown in the figures). The control system may be configured to receive feedback from the CMP system and provide control signals to the CMP system. For example, the control system may be configured to provide variable distribution or variable speed functionality for the various components based on feedback signals received from the system. Accordingly, the system may adjust the rotational speeds of the wafer and the polishing platen during the CMP process to achieve a more pronounced atmospheric plasma effect. In addition, the atmospheric plasma generator system may be configured to receive input from the control system and provide outputs based on various operating states of the generator system for improved functionality.

Modifications due to atmospheric plasma treatment with respect to a wafer or to the polyurethane non-woven "fibers" and sponge-like porous structures of a polishing pad, both on the surface and within the thickness, tend to make those surfaces more capable of receiving and holding slurry particles. For example, polyurethane non-woven "fibers" or sponge-like porous structures that have been treated with atmospheric plasma surface, as described herein, become more effective and more efficient as a multitude of temporary crevices to secure slurry particles on the surface. Thus, utilizing atmospheric plasma in the treatment of a surface tends to reduce the need to constantly flood, for example, a surface (e.g., polishing pad surface) with polishing slurry of which a high percentage is otherwise simply pushed to the edge of a polishing pad and deposited into a drain system never to be used again.

Two important factors may be optimized using the disclosed technology. The first is the effectiveness of atmospheric plasma treatment to the surface of the pad which is moist from the polishing slurry. The second is the lag time between the application of atmospheric plasma to the surface of the pad, and the point in time when that pad surface is contacted by the rotating wafer.

There are a variety of structural and chemical analyses that may be used to quantify the effects of atmospheric plasma on the surface of, for example, a polishing pad or a wafer. Characteristics of an atmospheric plasma-treated surface of a CMP component may include improvements in, for example, (a) wetting properties including wicking measures and contact angles, (b) surface energy properties which quantify attractive forces between, for example, a pad and slurry or slurry particles, (c) zeta potential indicating the degree of electrostatic repulsion between adjacent and similarly charged particles in a slurry, and (d) surface morphology measurements that characterize surface roughness and texture. One or more of these characteristics may be estimated using images acquired by a scanning electron microscope or an atomic force microscope. Moreover, the pad or wafer surface may be analyzed chemically using X-ray photoelectronic spectroscopy, or Fourier transform infrared spectroscopy in order to study these improvements achieved by atmospheric plasma treatment with respect to the surface of a CMP component. In addition, mechanical property measurements can characterize the tensile strength of the pad material before and/or after treatment from an atmospheric plasma source and the tensile strength improvements provided by atmospheric plasma may be observed accordingly.

Figure 5:
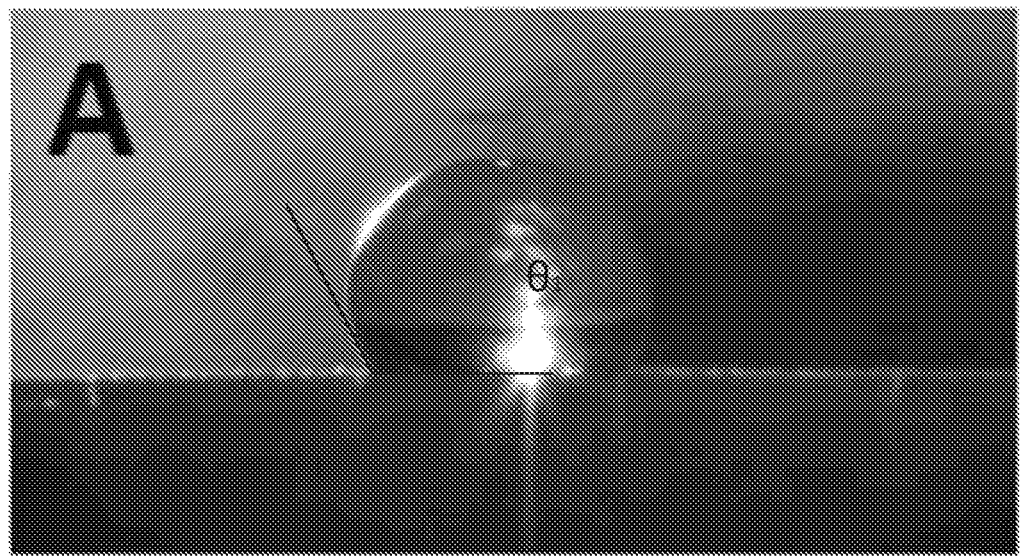
FIG. 5 is a photograph of a water droplet on the surface of a chemical mechanical planarization system polishing pad before application of atmospheric plasma.
Figure 6:
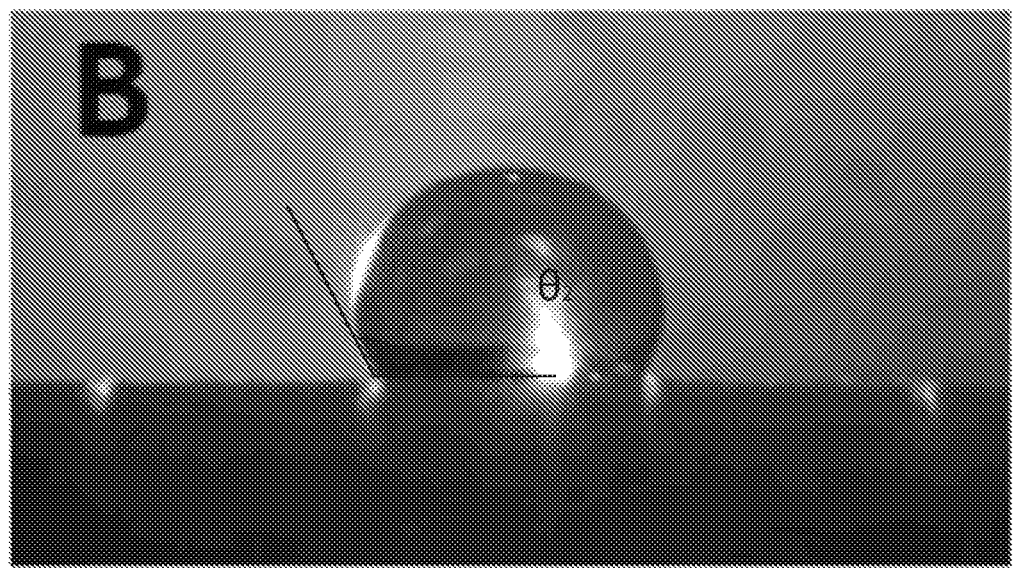
FIG. 6 is a photograph of a water droplet on the surface of a chemical mechanical planarization system polishing pad before application of atmospheric plasma.

FIGS. 5 and 6 are photographs of water droplets on the surface of a chemical mechanical planarization system polishing pad before application of atmospheric plasma. For both FIGS. 5 and 6, the water droplet has a high contact angle and thus, "beads" on the surface, illustrating or indicative of a hydrophobic surface. For example, contact angles, $\theta_1$ and $\theta_2$, shown are about 115°, which indicates that the surface of the part to be wetted has low wettability and thus, will result in incomplete wetting.

Figure 7:
FIG. 7 is a photograph of a water droplet on the surface of a chemical mechanical planarization system polishing pad after application of a first increment of atmospheric plasma.
Figure 8:
FIG. 8 is a photograph of a water droplet on the surface of a chemical mechanical planarization system polishing pad after application of first and second increments of atmospheric plasma.
Figure 9:
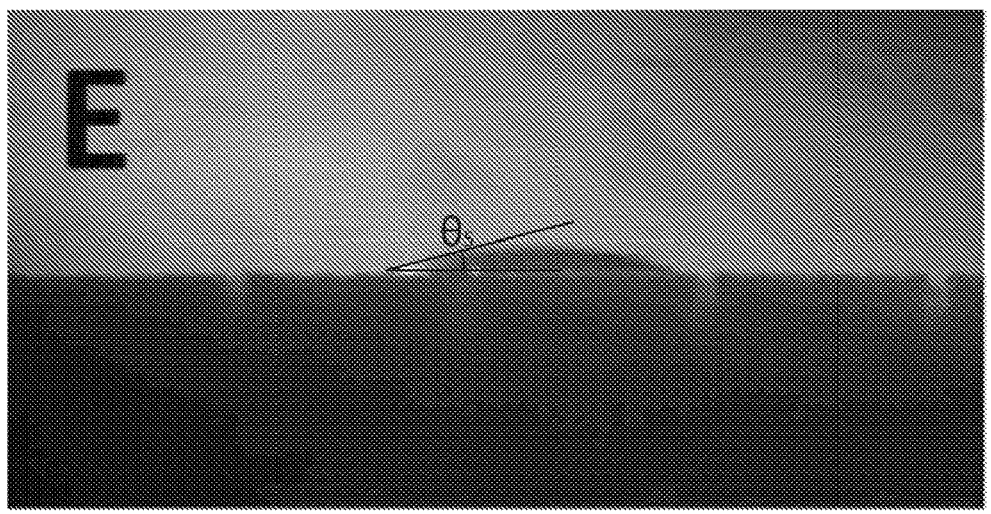
FIG. 9 is a photograph of a water droplet on the surface of a chemical mechanical planarization system polishing pad after application of first, second and third increments of atmospheric plasma.

FIG. 7 is a photograph of a water droplet on the surface of a chemical mechanical planarization system polishing pad after application of a first increment of atmospheric plasma. When compared with FIGS. 5 and 6, the contact angle, $\theta_3$, is approximately 60°, which is less than and thus an improvement over the contact angle of the untreated surface of 115°. The surface is less hydrophobic and more hydrophilic, as a result. FIG. 8 is a photograph of a water droplet on the surface of a chemical mechanical planarization system polishing pad after application of first and second increments of atmospheric plasma where each additional increment corresponds to an increase in atmospheric plasma energy (or intensity). The contact angle, $\theta_4$, is approximately 40°, which is less than, and thus an improvement over the 115° contact angle in the untreated surface in FIGS. 5 and 6, as well as the single-treated surface of FIG. 7. FIG. 9 is a photograph of a water droplet on the surface of a chemical mechanical planarization system polishing pad after application of first, second and third increments of atmospheric plasma. The contact angle, $\theta_5$, is approximately 15°, which is less than, and thus an improvement over the 115° contact angle in the untreated surface in FIGS. 5 and 6, as well as the single-treated surface of FIG. 7, as well as the double-treated surface of FIG. 8. With additional treatments, the surface can continue to have improved wettability, as the contact angle approaches 0°, or an angle just above 0°, such as 1°-5° and where the liquid drop can be described as "spreading." The benefits in the reduced contact angle provided for one or more treatments can fall in a range between this lower threshold of 1°-5°, and to an upper threshold of less than or about 115° or 110°, or any of the above angles described with reference to FIGS. 7-9.

Ultimately, the contact angle of the fluid droplet on the polishing pad surface from FIGS. 5 and 6, with no atmospheric plasma treatment, to FIGS. 7, 8, and 9 with one, two and three increments of atmospheric plasma treatment, results in a progression of lower contact angles and an increasingly hydrophilic surface. This illustrates the improvement in "wettability" of the surface of polishing pad 110 as atmospheric plasma energy is increased incrementally. The lower contact angle between the water droplet and the pad surface also indicates an increase in surface energy produced by the atmospheric plasma treatment. It is anticipated that similar improvements to the wettability and reduction in contact angle may be observed by adjusting one or more parameters of the atmospheric plasma process, such as increasing the discharge power, increasing the exposure time and selecting the nature of the gas used. Such changes in the plasma process may provide these improvements, with or without multiple treatment steps. Thus, through one or more atmospheric plasma treatment steps, or through adjusting the plasma process parameters, the contact angle between a fluid on the polish pad surface and the polish pad surface, relative to an untreated polish pad surface, can be reduced by approximately 10°, 20°, 30°, 40°, 50°, 60°, 70°, 80°, 90°, 100°, 110°, or about 114°. The resulting contact angle of the atmospheric plasma treated surface can be approximately 1°, 2°, 3°, 4°, 5°, 10°, 20°, 30°, 40°, 50°, 60°, 70°, 80°, 90°, 100°, or 110°, or any incremental or integral range or number therebetween (all of which are less than the untreated contact angle of 115° shown in FIGS. 5-6). It is noted that such changes in the contact angle may result with or without adjustment of any parameters described above when providing multiple atmospheric treatments in succession. Similar unexpected results are foreseen for non-water liquids, such as wafer processing fluids, such as CMP slurries.

It is noted that FIGS. 5-9 are approximately to scale, including the angles shown (unlike the other figures, which are not necessarily to scale). Moreover, substantially the same decrease in contact angle results with the use of CMP slurries as opposed to water with the same positive trend in improved wettability and reduced contact angle. Furthermore, substantially the same results shown in FIGS. 5-9 have been observed with respect to treating the surface of a wafer with atmospheric plasma.

These improvements in the wettability, lower hydrophilic nature, and contact angle of the pad surface will in turn result in the need for less overall slurry consumption and will improve the Cost of Ownership of the Chemical Mechanical Polishing process. An additional advantage of this type of treatment is that the modification caused by the atmospheric plasma may in some embodiments be limited only to the uppermost layers of the polishing pad. In such embodiments, the atmospheric plasma treatment may reduce any effect to the characteristics of the overall thickness of the polishing pad. The process is environmentally friendly in its initial use on the polishing pad, and also in the fact that less polishing slurry will be needed to perform the CMP polishing process and thus less slurry will be wasted. Reduced slurry use results in reduced need for chemical disposition or costly innovative recycling technologies.

Figure 10:
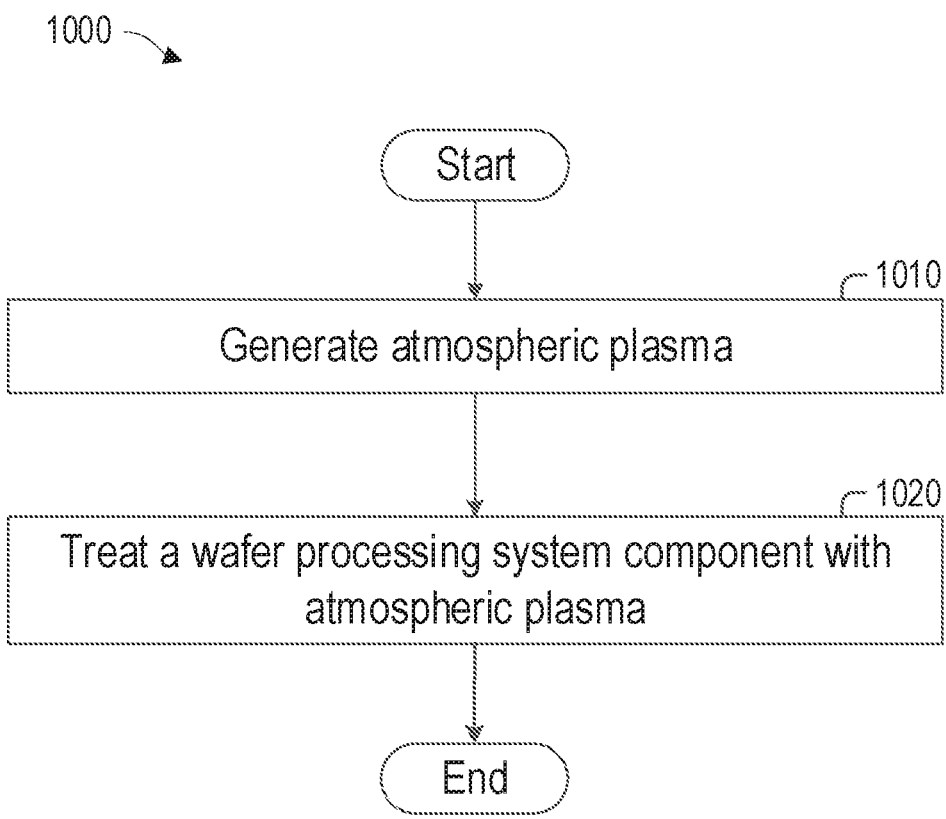
FIG. 10 is a flowchart illustrating an example method for treating a wafer processing system component with atmospheric plasma.

FIG. 10 is a flowchart illustrating an example method 1000 for treating a wafer-processing system component, such as a polishing pad, with atmospheric plasma. In some aspects, method 1000 may be performed by the system 100 of FIGS. 1 and 2. In some aspects, method 1000 may be performed by the system 300 of FIG. 3. In some aspects, method 1000 may be performed by the system 400 of FIG. 4, or other systems.

In block 1010 atmospheric plasma is generated. For example, the atmospheric plasma is generated using electrical energy as described above with reference to the example of a DC plasma jet. In block 1020, the atmospheric plasma generated in block 1010 can be used to treat a wafer processing system component, such as a polishing pad. Block 1010 may be performed, for example, by the atmospheric plasma generator 130, with block 1020 treating the polishing pad 110 of FIGS. 1 and 2. Block 1010 may be performed, for example, by the atmospheric plasma generator 133, with block 1020 treating the polishing pad 110 of FIG. 3. In another embodiment, the functionality of block 1010 may be performed, for example, by the atmospheric plasma generator 136, embedded in another component of system 400, such as polishing pad 110, with block 1020 treating the polishing pad 110 of FIG. 4. Method 1000 can, in some embodiments, alternatively or additionally include treating a wafer surface with atmospheric plasma. For example, the in-situ process described with reference to FIG. 4 can be implemented to treat the surface of the wafer facing the polishing pad. Method 1000 can include a step of moving an atmospheric plasma generator relative to a polishing pad. Method 1000 can be implemented within a CMP process, to polish or treat a wafer while utilizing an atmospheric plasma-treated polishing pad. Such a process can include delivering a slurry containing a CMP-suitable slurry (e.g., with abrasive and corrosive particles) to a surface of the atmospheric plasma-treated polishing pad. Example CMP slurries may include abrasive materials, such as silicon dioxide, cerium oxide, aluminum oxide, and other substances, such as rust inhibitors, and other chemistries. The process can further include polishing a wafer with the abrasive and corrosive particles. Such polishing can include moving a wafer carrier relative to a polishing pad.

It will be understood that the atmospheric plasma treatment methods and equipment herein can be implemented without the full CMP systems shown. For example, a separate atmospheric plasma generator can be implemented to treat a CMP polishing pad, wafer, or other component, prior to being brought within the context of the remainder of the CMP systems shown in FIGS. 1-4. Additionally, other CMP equipment can implement the atmospheric plasma features described herein, including multiple-head CMP systems, orbital CMP systems, or other CMP systems. For example, the atmospheric plasma treatment methods and equipment described herein can be implemented within sub-aperture CMP systems. A sub-aperture CMP system can include a polishing pad which is smaller in diameter than the wafer. The wafer is typically oriented face-up with slurry dispensed on its surface, while the wafer and polishing pad are rotated as the pad sweeps across the wafer.

For the CMP process, in-line adoption of atmospheric plasma treatment will be suitable as a steady-state POU modification to existing legacy CMP planarization tools (polishing machines), and as a feature of new CMP planarization tools. This adoption will be more effective than large scale, vacuum chamber plasma techniques in an expensive batch style process that could be envisioned at the polishing pad OEM level. The effects of the atmospheric plasma on the typical CMP polishing pad are likely to be too temporary in nature to facilitate batch style processing at the OEM, especially when factoring in the time element in shipping to and storing at the point-of-use customer site (the wafer fab or foundry).

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Conjunctive language such as the phrase "at least one of X, Y, and Z," or "at least one of X, Y, or Z," unless specifically stated otherwise, is to be understood with the context as used in general to convey that an item, term, etc. may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general-purpose computer comprising one or more processors should not be interpreted as excluding other computer components, and may possibly include such components as memory, input/output devices, and/or network interfaces, among others.

While the above detailed description has shown, described, and pointed out novel features as applied to various embodiments, it may be understood that various omissions, substitutions, and changes in the form and details of the devices or processes illustrated may be made without departing from the spirit of the disclosure. As may be recognized, certain embodiments of the disclosed technology described herein may be embodied within a form that does not provide all of the features and benefits set forth herein, as some features may be used or practiced separately from others. The scope of certain aspects of the technology disclosed herein is indicated by the appended claims rather than by the foregoing description. All changes which come within the meaning and range of equivalency of the claims are to be embraced within their scope.

What is claimed is:

1. A system for polishing a wafer, the system comprising:
   a polishing pad affixed to a top surface of a platen, the polishing pad having a first surface configured to polish the wafer;
   an atmospheric plasma generator configured to: generate atmospheric plasma at a pressure that is substantially the same as surrounding atmosphere, and directly apply the atmospheric plasma to the first surface of the polishing pad to treat the first surface of the polishing pad to modify a processing characteristic of the first surface of the polishing pad;
   a slurry delivery system configured to deliver processing slurry to the first surface of the polishing pad; and
   a wafer carrier configured to hold a wafer and allow the wafer to be polished by the first surface of the polishing pad.

2. The system of claim 1, wherein the wafer carrier comprises a membrane attached to the wafer carrier, the membrane configured to provide pressure between the wafer and the polishing pad.

3. The system of claim 1, wherein the atmospheric plasma generator is embedded in the polishing pad to enable in-situ application of atmospheric plasma to the wafer.

4. The system of claim 1, wherein the atmospheric plasma generator is mounted above the polishing pad.

5. The system of claim 1, wherein the atmospheric plasma generator is movable relative to the polishing pad.

6. The system of claim 1, wherein the atmospheric plasma generator is mounted on a pad conditioning arm.

7. The system of claim 1, wherein the treating of the first surface the polishing pad with the atmospheric plasma reduces a hydrophobic nature of the polishing pad.

8. The system of claim 1, wherein the treating of the first surface the polishing pad with the atmospheric plasma reduces a contact angle between the first surface the polishing pad and a fluid droplet.

9. The system of claim 1, wherein the treating of the first surface the polishing pad with the atmospheric plasma increases a wettability of the first surface the polishing pad.

10. The system of claim 1, wherein the atmospheric plasma generator further comprises a jet head configured to directly apply the atmospheric plasma to the first surface the polishing pad.

11. The system of claim 10, wherein the jet head is grounded to earth potential to hold back at least a portion of potential-carrying parts of the atmospheric plasma from reaching the first surface of the polishing pad.

12. The system of claim 1, wherein the atmospheric plasma is directly applied to the first surface of the polishing pad at a location that is spaced apart from the wafer carrier.

13. The system of claim 1, wherein the atmospheric plasma generator is further configured to directly apply the atmospheric plasma to the first surface of the polishing pad during polishing of the wafer by the first surface of the polishing pad.

14. The system of claim 1, wherein the atmospheric plasma generator further comprises a direct current (DC) plasma jet comprising a jet head, the DC plasma jet is configured to:
   generate a pulsed electric arc;
   flow a process gas past the pulsed electric arc to excite the process gas into the atmospheric plasma; and
   pass the atmospheric plasma through the jet head to directly apply the atmospheric plasma to the first surface the polishing pad.

15. The system of claim 14, wherein the DC plasma jet is further configured to provide an electric discharge having a voltage in the range of 5-15 kV at a frequency in the range of 10-10 kHz to generate the pulsed electric arc.

16. A system for treating a component of a chemical mechanical planarization (CMP) system, the system comprising:
   a polishing pad of a chemical mechanical planarization (CMP) system, the polishing pad having a first surface configured to polish a wafer; and
   an atmospheric plasma generator configured to: generate atmospheric plasma at a pressure that is substantially the same as surrounding atmosphere, and directly apply the atmospheric plasma to the first surface of the polishing pad to modify a processing characteristic of the first surface of the polishing pad installed in the CMP system.

* * * * *